(12) United States Patent  (10) Patent No.: US 8,098,472 B2
Messer  (45) Date of Patent: Jan. 17, 2012

(54) SYSTEM AND METHOD FOR CONTROLLING AN ELECTROMAGNETIC FIELD GENERATOR

(75) Inventor: Jeffrey Messer, San Bernardino, CA (US)

(73) Assignee: Extremely Ingenious Engineering, LLC, Orlando, FL (US)

( * ) Notice: Subject to any disclaimer, the term of this patent is extended or adjusted under 35 U.S.C. 154(b) by 703 days.

(21) Appl. No.: 12/152,525

(22) Filed: May 15, 2008

(65) Prior Publication Data

US 2008/0284506 A1  Nov. 20, 2008

Related U.S. Application Data

(60) Provisional application No. 60/930,221, filed on May 15, 2007, provisional application No. 60/936,506, filed on Jun. 20, 2007, provisional application No. 61/004,373, filed on Nov. 27, 2007.

(51) Int. Cl.
*H01H 47/00* (2006.01)
*H01F 27/42* (2006.01)
*H01F 37/00* (2006.01)

(52) U.S. Cl. ............... 361/143; 361/139; 307/104
(58) Field of Classification Search ............ 361/143
See application file for complete search history.

(56) References Cited

U.S. PATENT DOCUMENTS

| | | |
|---|---|---|
| 514,168 A | 2/1894 | Tesla |
| 593,138 A | 11/1897 | Tesla |
| 645,576 A | 3/1900 | Telsa |
| 649,621 A | 5/1900 | Tesla |
| 685,953 A | 11/1901 | Tesla |
| 685,954 A | 11/1901 | Tesla |
| 685,955 A | 11/1901 | Tesla |
| 685,956 A | 11/1901 | Tesla |
| 685,957 A | 11/1901 | Tesla |
| 685,958 A | 11/1901 | Tesla |
| 787,412 A | 4/1905 | Tesla |
| 1,119,732 A | 12/1914 | Tesla |
| 2,205,204 A | 6/1938 | King |
| 3,432,664 A | 3/1969 | Robison |
| 3,758,869 A | 9/1973 | Wagner |
| 3,781,647 A | 12/1973 | Glaser |
| 3,909,736 A | 9/1975 | Huchital et al. |
| 4,379,253 A | 4/1983 | Myer |
| 4,485,426 A | 11/1984 | Kerls |
| 4,685,047 A | 8/1987 | Phillips, Sr. |
| 4,717,889 A | 1/1988 | Engelmann |
| 4,727,297 A | 2/1988 | Wolze |

(Continued)

OTHER PUBLICATIONS

U.S. Appl. No. 12/288,586, filed Oct. 21, 2008, Issa et al.

(Continued)

*Primary Examiner* — Dharti H Patel
(74) *Attorney, Agent, or Firm* — Milbank Tweed Hadley & McCloy LLP

(57) ABSTRACT

A system for driving an electromagnetic field generator. In one aspect, the system may include a plurality of transistors arranged in an H-bridge configuration, the H-bridge having first and second output terminals, first and second switching inputs, and a power input. The system may further include a control transistor coupling the power input to a power supply, and a diode having a cathode coupled to the power input and an anode coupled to ground. The first and second output terminals may be coupled to the electromagnetic field generator and the first and second switching inputs may receive switching signals based on an output of the electromagnetic field generator.

20 Claims, 7 Drawing Sheets

U.S. PATENT DOCUMENTS

| | | | |
|---|---|---|---|
| 4,872,100 A | 10/1989 | Diaz | |
| 4,916,379 A | 4/1990 | Wand et al. | |
| 4,937,832 A | 6/1990 | Rocca | |
| 4,945,721 A | 8/1990 | Cornwell et al. | |
| 4,956,579 A | 9/1990 | Albright | |
| 4,963,792 A | 10/1990 | Parker | |
| 5,103,366 A | 4/1992 | Battochi | |
| 5,173,643 A | 12/1992 | Sullivan et al. | |
| 5,225,623 A | 7/1993 | Krasnow | |
| 5,276,281 A | 1/1994 | Sato et al. | |
| 5,281,898 A | 1/1994 | Albright | |
| 5,739,997 A | 4/1998 | Gross | |
| 5,818,180 A | 10/1998 | Canclini | |
| 5,841,239 A | 11/1998 | Sullivan et al. | |
| 5,864,212 A | 1/1999 | Sullivan | |
| 6,052,017 A | 4/2000 | Pidutti et al. | |
| 6,118,229 A | 9/2000 | Lee | |
| 6,166,869 A | 12/2000 | Pidutti et al. | |
| 6,198,335 B1 | 3/2001 | Pakriswamy | |
| 6,259,305 B1 | 7/2001 | Pakriswamy | |
| 6,272,694 B1 | 8/2001 | Weaver et al. | |
| 6,320,508 B1 | 11/2001 | Giesler et al. | |
| 6,522,089 B1 | 2/2003 | Duong et al. | |
| 6,549,044 B2 | 4/2003 | Brambilla et al. | |
| 6,798,716 B1 | 9/2004 | Charych | |
| 6,883,509 B2 | 4/2005 | Porter et al. | |
| 6,906,486 B2 | 6/2005 | Berroth et al. | |
| 6,906,495 B2 | 6/2005 | Cheng et al. | |
| 6,911,848 B2 | 6/2005 | Vinciarelli | |
| 6,930,893 B2 | 8/2005 | Vinciarelli | |
| 6,934,166 B2 | 8/2005 | Vinciarelli | |
| 6,961,227 B1 | 11/2005 | Whiton et al. | |
| 7,027,311 B2 | 4/2006 | Vanderillie et al. | |
| 7,235,945 B2 | 6/2007 | Correa et al. | |
| 7,400,487 B1 | 7/2008 | Bitar | |
| 7,675,197 B2 | 3/2010 | Tetlow | |
| 2003/0011324 A1 | 1/2003 | Lee | |
| 2004/0248742 A1 | 12/2004 | Terashima et al. | |
| 2005/0046387 A1 | 3/2005 | Aker et al. | |
| 2005/0083059 A1 | 4/2005 | Morita et al. | |
| 2005/0148864 A1 | 7/2005 | Slade et al. | |
| 2005/0184689 A1 | 8/2005 | Maslov et al. | |
| 2005/0218843 A1* | 10/2005 | Chen et al. | 318/254 |
| 2006/0098378 A1 | 5/2006 | Gross | |
| 2006/0228548 A1 | 10/2006 | Ayai et al. | |
| 2007/0018629 A1 | 1/2007 | Potvin et al. | |
| 2007/0075053 A1 | 4/2007 | Smith et al. | |
| 2007/0145018 A1 | 6/2007 | Smith et al. | |
| 2007/0195561 A1 | 8/2007 | Suenaga et al. | |
| 2007/0222426 A1 | 9/2007 | Waffenschmidt et al. | |
| 2007/0263415 A1 | 11/2007 | Jansen et al. | |

OTHER PUBLICATIONS

U.S. Appl. No. 12/152,545, filed May 15, 2008, Messer.
U.S. Appl. No. 12/313,792, filed Nov. 25, 2008, Issa et al.
U.S. Appl. No. 12/214,655, filed Jun. 20, 2008, Issa.
U.S. Appl. No. 12/152,977, filed Jun. 20, 2008, Messer.
U.S. Appl. No. 12/152,976, filed May 15, 2008, Messer.
U.S. Appl. No. 60/930,221, May 15, 2007, Messer et al.
U.S. Appl. No. 60/936,506, filed Jun. 20, 2007, Messer et al.
U.S. Appl. No. 61/004,373, filed Nov. 27, 2007, Messer et al.
Tracy V. Wilson, How Wireless Power Works, www.howstuffworks.com, Nov. 20, 2008.
Minoru Watanabe, et al. A Study on High Temperature Superconductin Coil of Different Coil Arrangements, IEEE Transactions on Applied Superconductivity, Jun. 2007, vol, 17 No. 2.
Power Requirements for Cooling versus Temperature in Kelvin,www.metox.biz/super_roadmap, Jun. 8, 2008.
Cryostat, Wikipedia Encyclopedia,Jun. 1, 2008.
Resonator, Wikipedia Encyclopedia, Jun. 3, 2008.
Zenergy Receives Order for HTS Induction Heater, Semiconductor Week, Oct. 15, 2008, vol. 21 No. 18, Peregrine Communications.
Superconductivity Roadmap, www.metox.biz/super_roadmap, Jun. 8, 2008.
Miyagi, et al., AC Loss Characteristics of an assembled conductor of round Bi2223 Ag sheated wires, Elsivier Science B.V., Aug. 2002, vol. 372-376 Part 3 pp. 1727-1729.
Daumling, et al., Ac loss in superconducting power cables, Studies of High Temperature Superconductors, vol. 33.
O'Miura, et al, The development of a 2.5 T/100 kV A AC superconducting magnet using a high-J NbTi superconducting wire having Nb artificial pins, Supercond. Sci. Techno. Oct. 1993.
HTS-110 Leaders in HTS Magnetic Solutions, www.hts-110.co.nz, Jun. 8, 2008.
Michael Walker, et al., Performance of Coils Wound from Long Lengths of Surface-Coated, Reactedm BSCC0-2212 Conductor, IEEE Transactions on Applied Supercond. Jun. 1997, vol. 7 No. 2.
K. Hayashi, et al., Development of Ag-Sheated Bi2223 Superconducting Wires & Thier Applications, IEEE Transactions on Applied Superconductvity, Mar. 2001, vol. 11 No. 1.
A.B. Sneary,et al., Development og High Temperature Superconducting Coils Using Bi-2223/Ag Tapes, IEEE Transactions on Applied Superconductivity vol. 9 No. 2, Jun. 1999.
Mark S. Newson, et al., Progress on the Design and Operation of High-Tc Coils Using Dip-Coat BSCCO-2212/Ag Tape, IEEE Transactions on Applied Superconductivity, vol. 12 No. 1.
L. Bigoni, et al., Development of Bi-2223/Ag Tapes and Coils, IEEE Transactions on Applied Superconductivity, vol. 7 No. 2, Jun. 1997.
Pradeep Halder, et al., Developement of Bi-2223 HTS High Field Coils and Magnets, IEEE Transactions on Applied Superconductivity, Jun. 1995, vol. 5 No. 2.
PJ Masson, et al., HTS Machines as enabling technology for all-electric airborne vehicles, Superconductor Science & Technology, 2007, 748-756.
M. Ariante. et al., Characteristics of Coils wound with Mono and Multifilamentary Bi-2212/Ag from 4 to 80 K, IEEE Transactions on Magnetics vol. 32 No. 4, Jul. 1996.
Alexander Ilyusheckin, et al., Continuous Production of Bi-2212 Thick Film on Silver Tape, IEEE Transactions on Applied Superconductivity, vol. 9 No. 2, Jun. 1999.
Shinichi Nomura, et al., Helically Wound Coils for High Field Magnets, IEEE Transactions on Applied Superconductivity, vol. 14 No. 2, Jun. 2004.
Dan Combine, Radiant Energy and Over-Unity, Version 6, Oct. 2006.
Tomorrow's High-Temperature Superconducting Cables, www.innovations-report.com, Jun. 27, 2001.
Material Safety Data Sheet for SCS4050, SF12050, SF12100; High Temperature Superconductor Tape, Jun. 12, 2007, SuperPower Inc.
International Search Report for PCT/US2008/12013 dated Feb. 4, 2009.
International Search Report for PCT/US2008/06239 dated Aug. 26, 2008.
International Search Report for PCT/US2008/06176 dated Sep. 17, 2008.
International Search Report for PCT/US2008/13097 dated Feb. 4, 2009.
International Search Report for PCT/US2008/07655 dated Sep. 25, 2008.
Wireless Power Tesla Coil Demo, Last Accessed Sep. 14, 2009, http://www.youtube.com/watch?v=aG-We7A-i9U.
International Preliminary Report for PCT/US2008/007655 dated Jan. 7, 2010.
Issa, Anthony, Wireless Power Bus with Data Channel, NASA SBIR Technologies, Extremely Ingenious Engineering, Orlando FL.
NASA SBIR 2009 Phase 1 Form C-Budget Summary.
Issa, Anthony, Wireless Power Bus with Data Channel, Extremely Ingenious Engineering, LLC.
Wireless Data and/or Power Connectivity for Small Spacecraft, Extremely Ingenious Engineering.
Information about Principal Investigators/Project directors and co-Principal Investigators/co-Project Directors, Dec. 2009.
Page, Lewis, Lightning-gun tech approaching weaponisation, www.theregister.co.uk, Aug. 26, 2009.
Tobias, John, Experimental Studies of Wave Propagation in Three-Dimensional Photonic Crystals, May 2002.
Tobias, John and Grebel H., Self-Imaging in photonic crystals in a subwavelength range, Optice Letters, Dec. 1, 1999, vol. 24, No. 23.

Tobias, John, Ajgaonkar M., Grebel H., Morphology-dependent transmission through photonic crystals, J. Opt. Soc.Am.B., Mar. 2002, vol. 19, No. 3.
Qels 2002, Tuesday Afternoon.
Mar. 15, 2010 Non-final Rejection for 12/152,976.
Apr. 16, 2010 Notice of Allowance, for 12/152,977.
Jul. 19, 2010 Notice of Allowance, for 12/152,977.
Aug. 26, 2010 Notice of Allowance, for 12/152,977.
Oct. 14, 2010 Ex Parte Quayle Action, for 12/288,586.
Nov. 5, 2010 Non-final Rejection, for 12/152,545.
Miniature Vacuum Tube Tesla Coil, Last accessed Nov. 17, 2009, www.capturedlightning.org/hot-streamer/electrontube/minivttc.htm.
MINITTC.bmp image, Last accessed Nov. 17, 2009, www.capturedlightning.org/hot-streamer/electrontube/minivttc.bmp.
Nov. 10, 2010 Ex Parte Quayle Action, for 12/313,792.
Dec. 8, 2010 Response to Office Action, for 12/288,586.
Feb. 4, 2011 Notice of Allowance, for 12/288,586.
Feb. 11, 2011 Proposed Amendment After Notice of Allowance, for 12/288,586.
Feb. 15, 2011 Amendment After Notice of Allowance, for 12/288,586.
Mar. 1, 2011 Response to Amendment After Final, for 12/288,586.
Dec. 8, 2010 Response to Office Action, for 12/313,792.
Feb. 14, 2011 Notice of Allowance, for 12/313,792.

* cited by examiner

SYSTEM AND METHOD FOR CONTROLLING AN ELECTROMAGNETIC FIELD GENERATOR

This application claims the benefit of provisional patent application Ser. No. 60/930,221, filed May 15, 2007; U.S. provisional patent application Ser. No. 60/936,506. filed Jun. 20, 2007; and U.S. provisional patent application Ser. No. 61/004,373, filed Nov. 27, 2007, the entire contents of each of which are hereby incorporated by reference into the present disclosure. This application further hereby incorporates by reference U.S. non-provisional patent application Ser. No. 12/152,545, titled "System and Method for Forming and Controlling Electric Arcs," filed May 15, 2008

FIELD OF THE INVENTION

The present invention relates to an system and method for controlling an electromagnetic field generator.

BACKGROUND OF THE INVENTION

Various types of solid state Tesla coil (SSTC) speakers are known. With high frequency (1-5 MHz) E-class SSTC speakers as the E-class exception, SSTC speakers typically create audio via modulating the dead times on the gates of the 4H-bridge transistors. High frequency E-class SSTC speakers modulate the wave via controlling a MOSFET gate or by applying a ~100V ~400 watt audio signal over an E-class system.

SUMMARY OF THE INVENTION

The present disclosure relates to a system for driving an electromagnetic field generator. In one aspect, the system may include a plurality of transistors arranged in an H-bridge configuration, the H-bridge having first and second output terminals, first and second switching inputs, and a power input. The system may further include a control transistor coupling the power input to a power supply, and a diode having a cathode coupled to the power input and an anode coupled to ground. The first and second output terminals may be coupled to the electromagnetic field generator and the first and second switching inputs may receive switching signals based on an output of the electromagnetic field generator.

BRIEF DESCRIPTION OF THE DRAWINGS

Features and other aspects of embodiments of the present invention are explained in the following description taken in conjunction with the accompanying drawings, wherein like references numerals refer to like components, and wherein:

FIG. 5A illustrates an output wave in accordance with embodiments of the present invention;

The drawings are exemplary, not limiting.

DETAILED DESCRIPTION

Various embodiments of the present invention will now be described in greater detail with reference to the drawings.

In one aspect, the system of the present disclosure may use a transistor or paralleled transistors to pulse energy into a bridge system that turns the pulsed DC wave into a pulsed high frequency AC waveform. This design may allow for bridge resonation to continue without interruption while modulated energy can be pulsed into the bridge.

Figure 1:
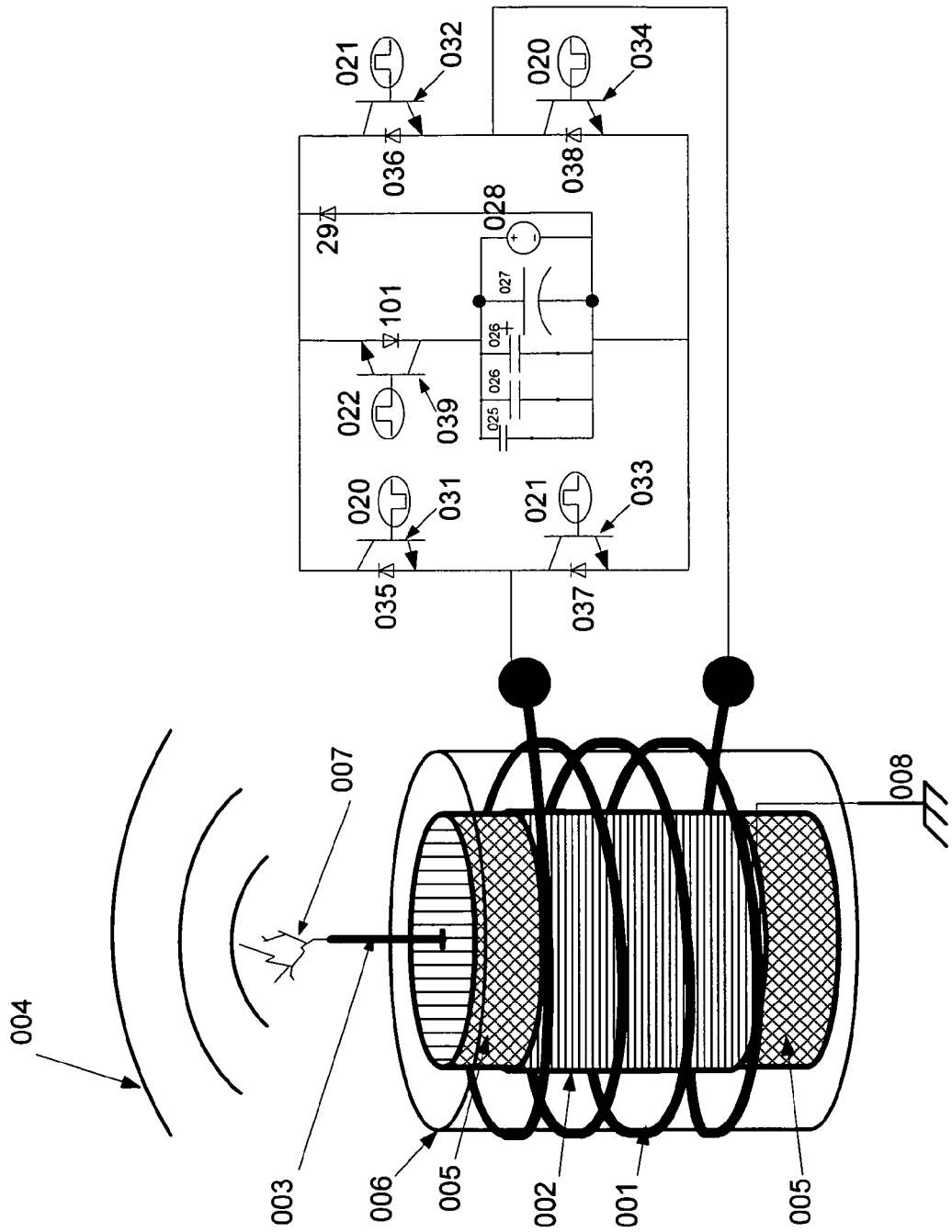
FIG. 1 illustrates an apparatus for forming an electric arc from electromagnetic field generator with control circuitry in accordance with embodiments of the present invention.

As shown in FIG. 1, one embodiment of the present invention may include insulated gate bipolar transistors (IGBTs) 031, 032, 033, and 034 in an H-bridge configuration with a Q-bridge IGBT 039 controlling the bus voltage between the DC supply 028 and the positive DC input of the H-bridge configuration. In further aspects, this solid state bridge system may drive an electromagnetic field generator or other resonant system. In one aspect, the electromagnetic field generator may be a solid state Tesla coil having a primary winding 001, which may be wrapped around a non-conductive form 006. Primary winding 001 may induce a current into the secondary winding 002 which may act as a Tesla resonator and may be wrapped on a non-conductive form 005. Secondary winding 002 is connected to discharge electrode 003 (not pictured).

In further aspects, when voltages ring up in the secondary winding 002, a voltage drop between the ground 008 and the discharge electrode 003 may emit lightning 007, which may be modulated to create sound waves. This may result in some electrons being ripped from air molecules around the discharge electrode 003, creating an arc or plasma formations around the discharge electrode 003. In further aspects, the resultant plasma may have power added or reduced, and in doing so may make sound wave concussions. Power in the plasma may be added or reduced by the secondary winding 002, which may receive its energy from primary winding 001. Primary winding 001 may receive its AC energy from an H-bridge including IGBTs 031, 032, 033, and 034. IGBTs 031, 032, 033, and 034 may receive their energy from DC source 028, which may be regulated by Q-bridge IGBT 039, which may be controlled by signal 022, which may be a pulse width modulation (PWM) digital signal (for example, signals 058 and 059 as shown in certain aspects of the invention presently disclosed in FIGS. 3A-3D).

In further embodiments, IGBTs 032 and 033 may receive and be controlled by signal 021 and IGBTs 031 and 034 may receive control signal 020. The signal 021 may switch the IGBTs at or near the resonant frequency phase of the electromagnetic field generator such that the energy driven into the primary winding 001 may prove energy to the secondary winding 002. In further aspects, when the secondary winding 002 is highly energized and/or when the primary winding 001 is in resonance with the secondary winding 002, high peak current may damage IGBTs 031, 032, 033, and 034, unless IGBTs 031, 032, 033, and 034 are switched at the zero current crossings. This window where IGBTs 031, 032, 033, and 034 may be switched may limit the dead time controls over IGBTs 031, 032, 033, and 034 and the frequency at which they may switch. In further embodiments, Q-bridge IGBT 039 may have no such limitations when, for example, high currents are present in the secondary winding 002. In further aspects, the Q-bridge IGBT 039 may switch at any frequency or pulse width and may not be limited to the resonant frequency of the secondary winding 002.

Figure 2:
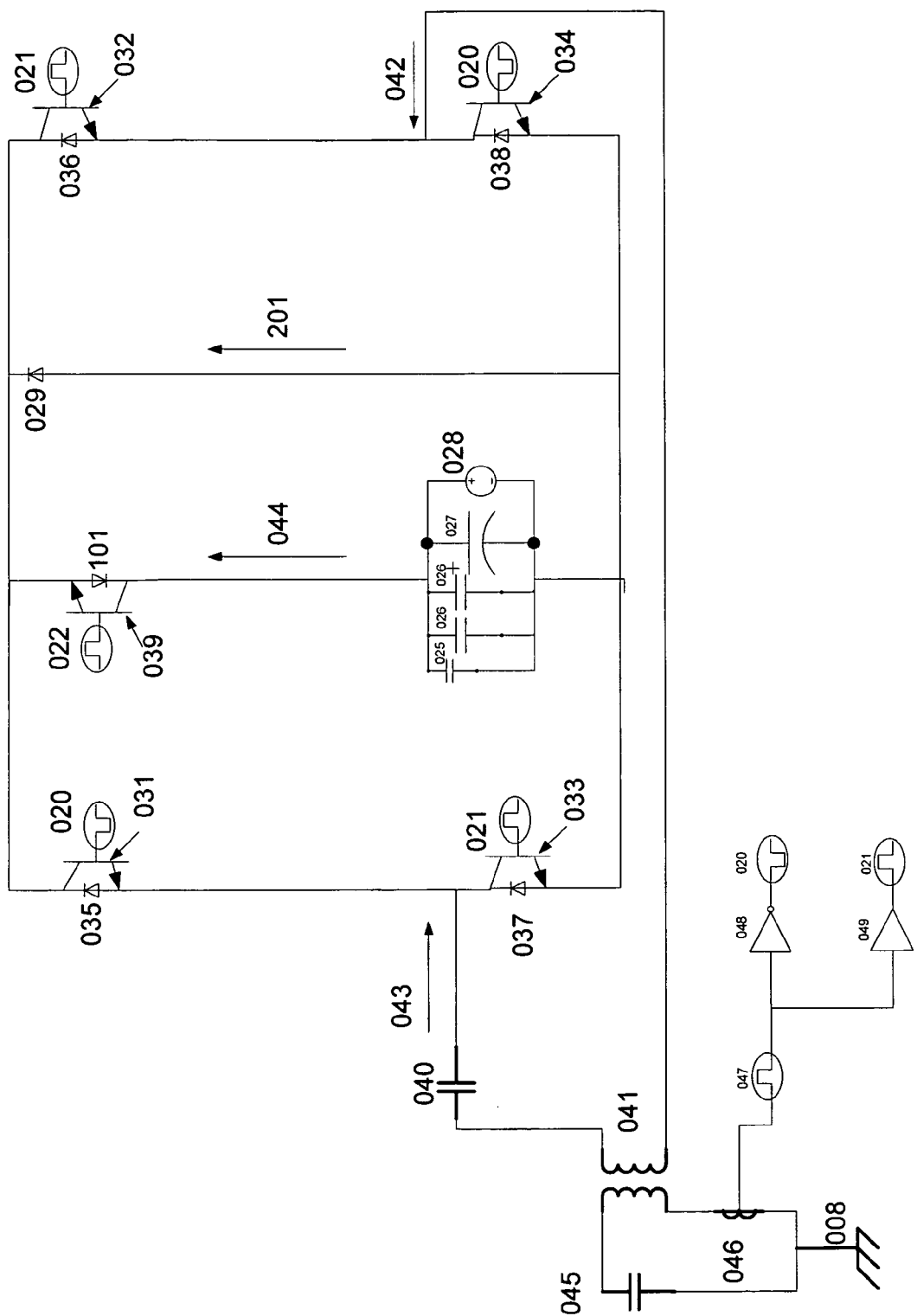
FIG. 2 illustrates control circuitry in accordance with embodiments of the present invention.

As shown in FIG. 2, one embodiment of the present invention may include a Q-bridge IGBT configuration connected to a primary winding acting as a Tesla resonator (represented here by inductor 041) with a self capacitance in the secondary of capacitor 045 and secondary winding grounded with a current drive transformer (CDT) 046 located in between the bottom of the secondary winding and ground 008. In further embodiments, CDT 046 may send analog signal 047 to inverting driver 048 that may output digital signal 020 and non-inverting driver 049 that may output digital signal 021 to drive H-bridge IGBTs 031, 032, 033, and 034. It is instructive to note, for purposes of this drawing, full depiction of an electromagnetic field generator, such as a Tesla resonator, is not shown in its entirety to better focus on the currents in the Q-bridge. Furthermore, inductor 041 may be shown to represent an electromagnetic field generator, such as a Tesla resonator, for purposes of showing that embodiments of the invention may include a device to drive and store electromagnetic resonate energy into the Q-bridge so that the electromagnetic field generator may be used to generate a feedback signal, where a digital signal may be acquired to drive the H-bridge IGBTs 031, 032, 033, and 034. The electromagnetic field generator may be an AC resonant system and the primary winding inductor 041 and primary capacitor 040 may be said to be holding electromagnetic energy such that they resonate at some natural resonant frequency. The logic system that generates signals 021 and 020 may receive feedback from resonations of inductor 041 and capacitor 040 such that they may switch the DC bus current to aid in these resonations. The logic system may include inverter 048 and non-inverter 049, such as may be found in a Hex-inverter, to generate digital signals. If, for example, the gate logic control signals 021 and 020 are zero (low), then the H-bridge may no longer resonate and any electromagnetic energy inside the Tesla resonator and/or primary winding inductor 041 and primary capacitor 040 may flow back into the bridge system, in direction shown via current indicators 043 and 042, one current path for each direction in which the resonate energy flows. In further aspects, this current then may be rectified via diodes 035, 036, 037, and 038. Energy may then flow through diode 101 to charge the DC bus capacitors 025, 026, and 027. In effect, when IGBTs 031, 032, 033, 034, are turned off, all the energy in the electrodynamic dimension may charge the DC bus line and the Tesla coil may be off or may no longer be in oscillation.

In further aspects, if the Q-bridge gate input logic 022 is at zero volts or is held low, IGBT 039 may be off and no power may travel from the DC bus capacitor 027 or from the DC power source 028 to the resonate system (inductor 041 and capacitor 040). In one example, electrically turning off the Q-bridge IGBT 039 may be similar to removing the DC bus power supply 028 completely. The turning off of the Q-bridge IGBT 039 may not result in stopping the Tesla resonator oscillations, but may result in a dip in the electrodynamic energy in the Tesla resonator for the duration that the Q-bridge IGBT 039 may be off. In further examples, when the Q-bridge IGBT 039 may be off, current 044 may not flow and a freewheel diode 029 may be added so that current 201 may flow from the bottom to the top of the H-bridge. This diode may protect the IGBT 039 from stray inductance loops, which in the case of high current, may result in very high peak voltages that may destroy the IGBT 039.

Figure 3A:
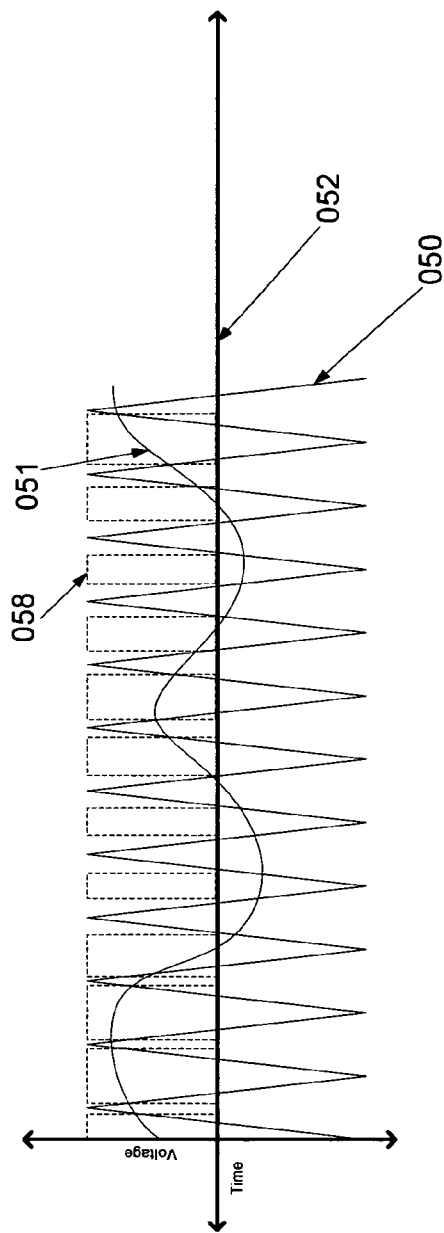
FIG. 3A shows a graph of voltage inputs and output with a standard center of oscillation over time in accordance with embodiments of the present invention.

As shown in FIG. 3A, one embodiment of the present invention may include an input wave 051, such as an audio wave, oscillating around a center point 052 and the input wave 051 is referenced against the triangle wave 050. For correct pulse width modulations, audio wave 051 and triangle wave 050 may input directly to the + and − pins of a comparator or op-amp, respectively, such that when the input wave 051 is above the triangle wave 050, the op-amp or comparator's output may be "1", and when the input wave 051 is below the triangle wave 050, the op-amp or comparator's output may be "0." The resulting digital "1" and "0" pulse width modulated signal 058 may then be input into the gate of the Q-bridge IGBT 039 at any triangle wave frequency or may be used to control dead times (i.e., dead time controls (DTC)) on the H-Bridge IGBTs 031, 032, 033, and 034. In one embodiment, this may result in creating a high power audio signal to feed into a Tesla resonator through an H-bridge.

Figure 3B:
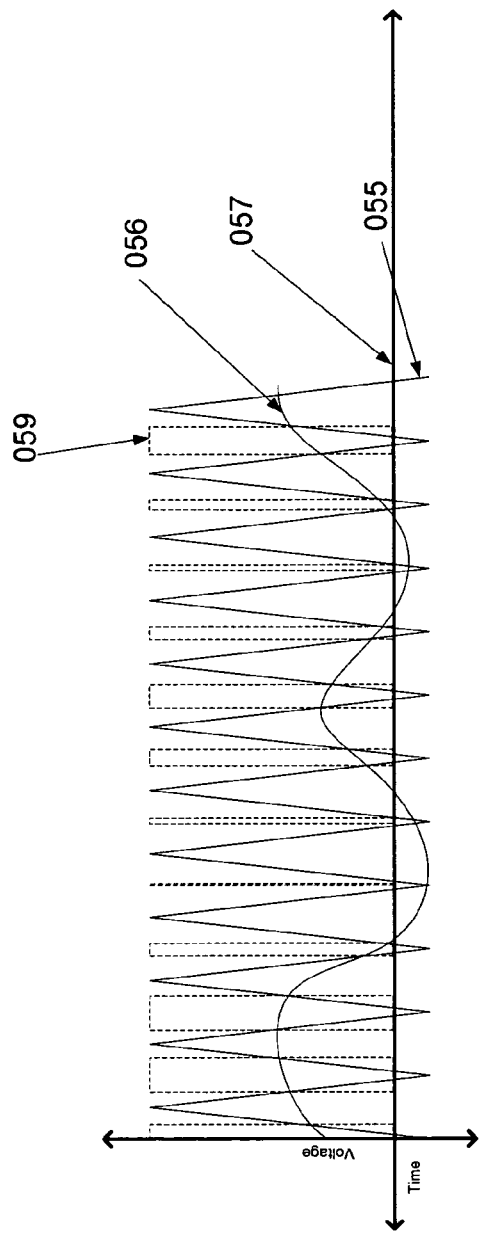
FIG. 3B shows a graph of voltage inputs and output with a lower center of oscillation over time in accordance with embodiments of the present invention.

In further aspects, sound waves from plasma may be created by changing the surface area of the plasma. As shown in FIG. 3B, one embodiment of the present invention may include the input wave 056 oscillating around a center point 057, which may be below the middle of the triangle reference wave 055. This may allow for larger changes of plasma at the discharge electrode which may result in louder and more "booming" sounds. This effect may be referred to as the "boom factor". In further aspects, the farther the center point 057 of audio oscillation may be from the center of the reference triangle wave 055, the larger the boom factor. When using pulse width modulation of triangle wave 055 and input wave 056, with the boom factor enabled, i.e., lowered center point 057, less energy overall may be used. In further embodiments, this may be shown by pausing the audio signal shown in FIG. 3d.

Figure 3C:
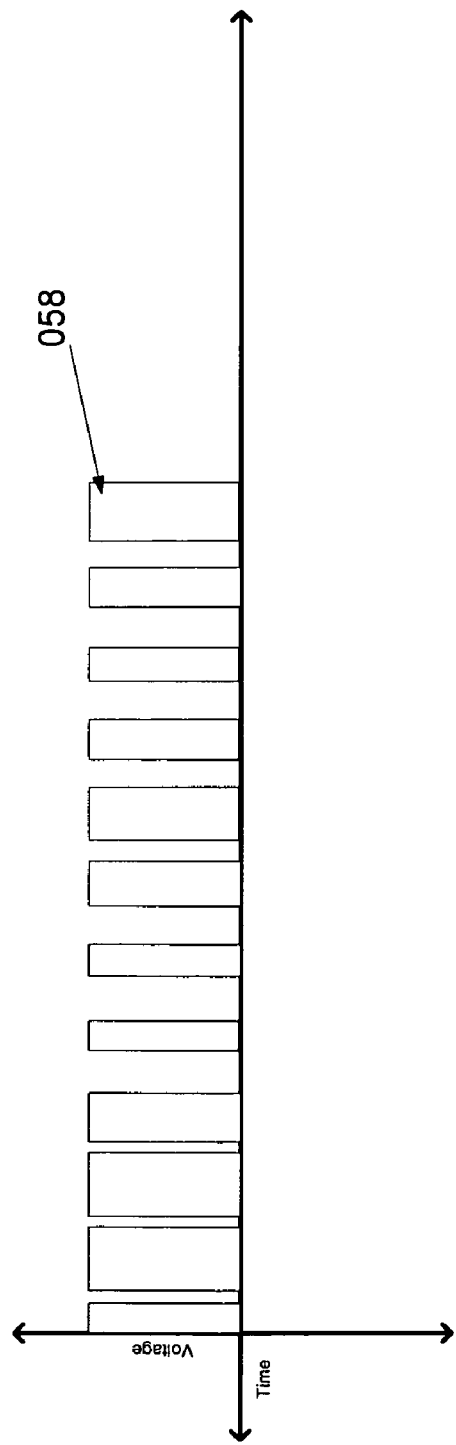
FIG. 3C shows a graph of PWM signal from a standard center of oscillation over time in accordance with embodiments of the present invention.
Figure 3D:
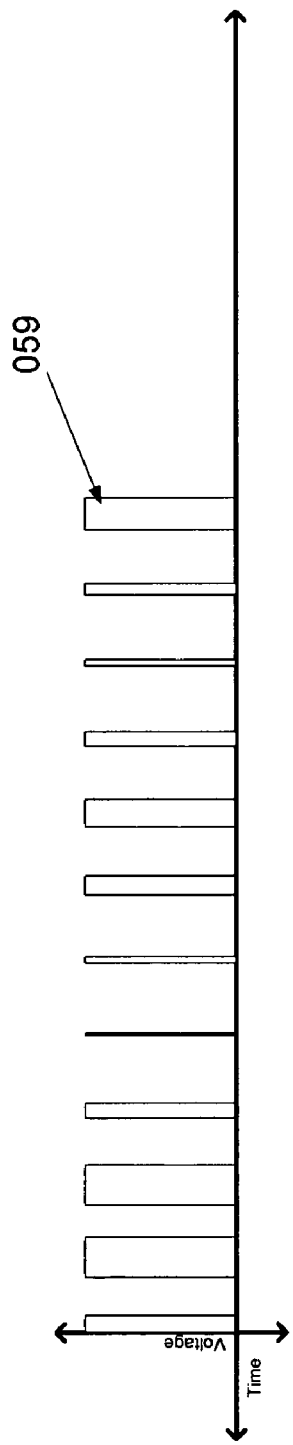
FIG. 3D shows a graph of PWM signal from a lower center of oscillation over time in accordance with embodiments of the present invention.

As shown in FIGS. 3C and 3D, digital PWM output 059 may have a smaller duty cycle than PWM non-boom factor wave 058, yet the boom factor 059 may result in louder plasma output, shown as 007 in FIG. 1, as it may expand and contract the plasma output 007 more than the non-boom factor wave 058. The width of the "1 s", or on-times, of the PWM digital wave 058 may be larger than the "1 s", or on-times of the PWM digital boom factor 059 as shown in FIG. 3C and FIG. 3D. In such embodiments, the boom factor may increase audio output while decreasing the power input.

Figure 4:
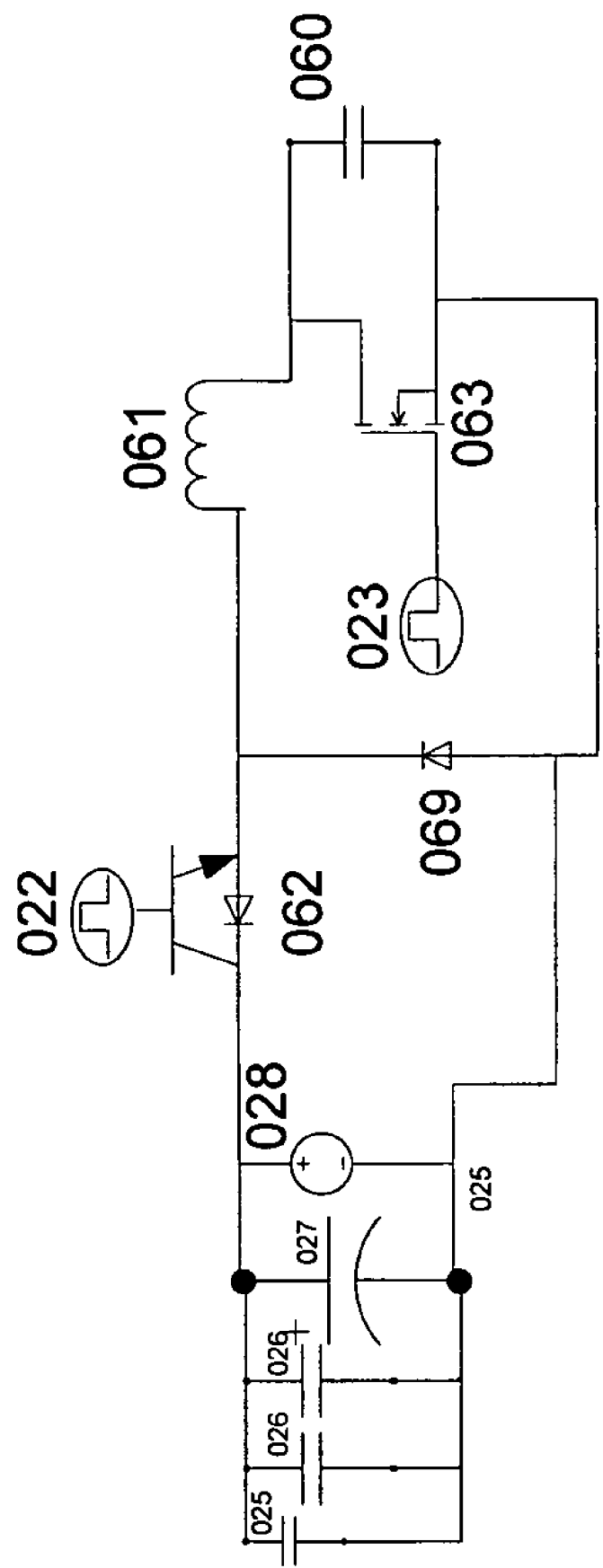
FIG. 4 illustrates a control circuit PWM output from FIG. 3A in accordance with an embodiment of the present invention.

As shown in FIG. 4, one embodiment of the present invention may include a MOSFET 063 in a class-E configuration, with a resonant system including a resonate capacitor 060 and resonate inductor 061. The MOSFET 063 may be driven by a logic wave 023, which, for example, may be around 1 Mhz-6 Mhz, and may be derived from an oscillator, for example, a crystal oscillator, and may be amplified (if needed) depending on the size of the MOSFET 063 gate capacitance.

In further aspects, the class-E MOSFET operation may allow for high frequency operation, where transient audio waves may be beyond the range of the human ear. However, the human ear may detect the amount of change in plasma surface area. Such embodiments may allow for resonant frequencies of the Tesla resonator to be above 2 MHz, where audio may be clear and that of high fidelity omnidirectional sound. In further aspects, the freewheel diode 069 may allow the class E operation to resonate without interruption and Q-bridge IGBT 062 may pulse energy directly into the class-E bridge. In further aspects, when the Q-bridge IGBT 062 may be off, resonant energy and stray inductance current may bypass the DC power supply 028 and Q-bridge IGBT 062 via freewheel diode 069. Such embodiments that may include this configuration of class-E MOSFET 063 operation with a pulsing Q-bridge IGBT 062 and freewheel diode 069 may increase the sensitivity and small bandwidth frequency window of a set E-class operation resonator.

In further aspects, the class-E MOSFET 063 may switch when voltage over the collector to emitter is zero, which may result in its fast 1-5 MHz operation. In one example, when the gate of the MOSFET 063 is turned on or off to the beat of music, and not to the zero voltage crossing from drain to source, a power loss may occur. When reproducing audio using a class-E operation MOSFET, the plasma modulate by controlling the MOSFET gate, using low powers. Further embodiments may modulate the voltage over the class-E operation system by applying a high wattage audio signal. While this may create clear audio at medium and high power levels, a large, high powered, costly amplifier may be used. In further embodiments, use of the Q-bridge IGBT 062 and freewheel diode 069 may supplant the use of such an audio amplifier, as a single IGBT may act as the amplifier with, for example, over 1 Kwatt output capabilities.

Figure 5A:
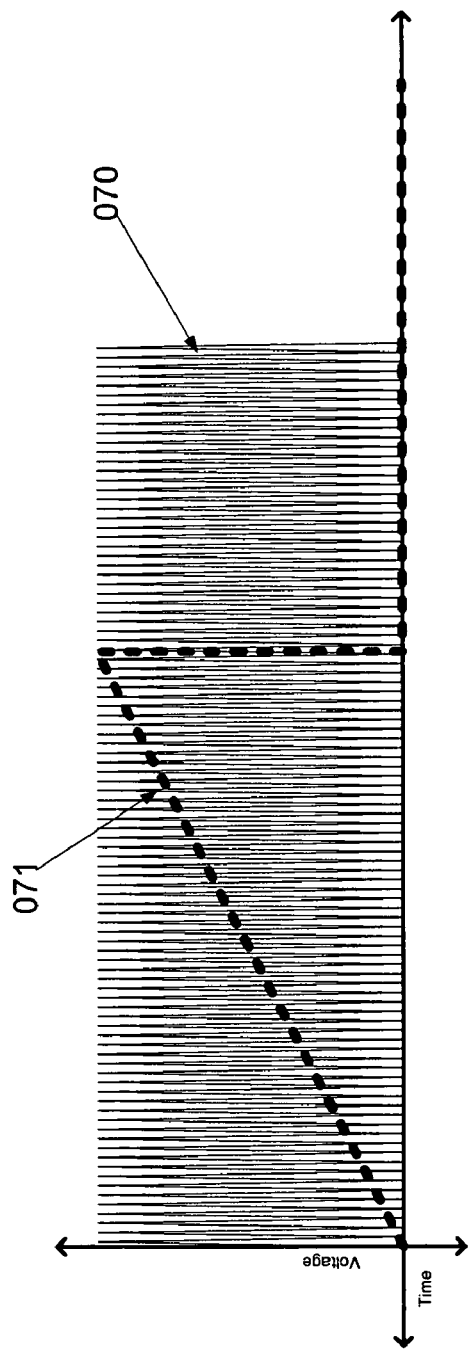
FIG. 5A illustrates an input signal and reference wave in accordance with embodiments of the present invention.
Figure 5B:
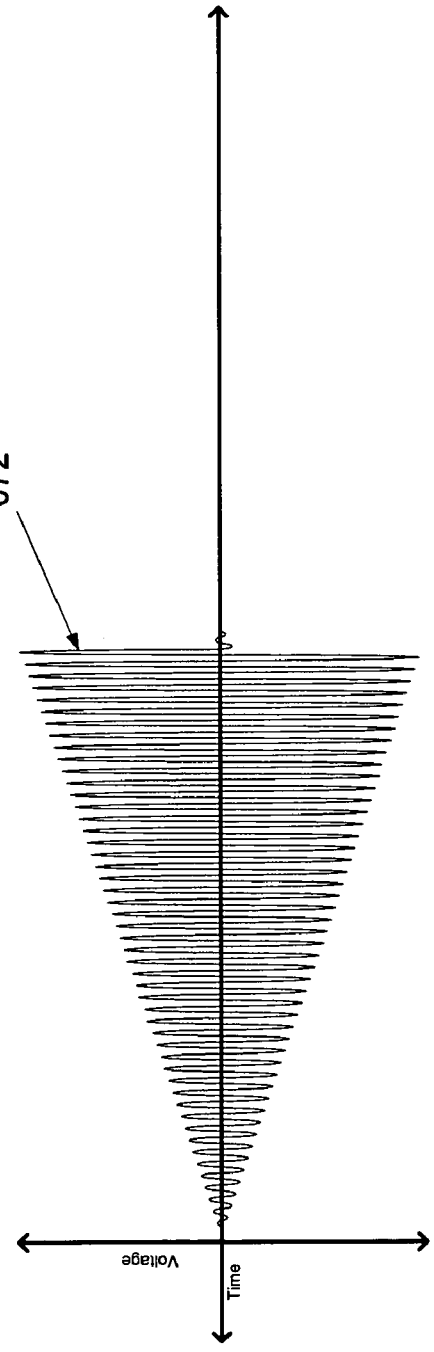

As shown in FIG. 5A, one embodiment of the present invention may include a signal 071 that may be referenced against a reference wave 070. A PWM signal generated from the signal wave 071 (here, a saw-tooth wave), and the reference wave 070 (here a triangle wave), may yield a pulsing signal with steadily increasing pulse widths. If signal 022, as shown in one embodiment in FIG. 1, is a PWM signal generated from signal wave 071 and reference wave 070, then the output of the Tesla coil may be graphed as shown in one embodiment of FIG. 5B, which may resemble a slowly increasing output waveform conducive to straight arc growth.

Figure 6:
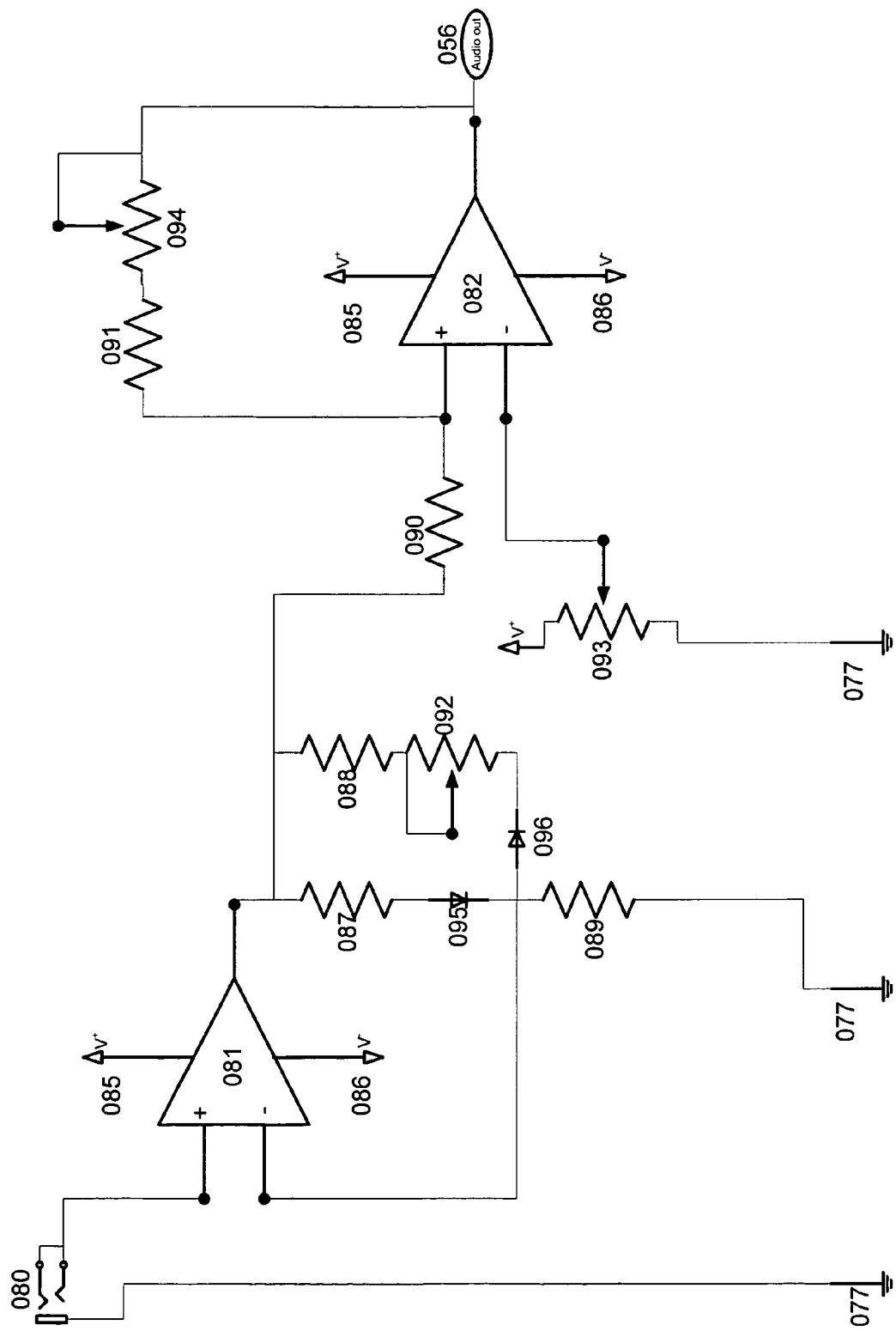
FIG. 6 illustrates circuitry in accordance with embodiments of the present invention.

As shown in FIG. 6, one embodiment of the present invention may include input jack 080, e.g., a 3.5 mm audio jack, coupled to printed circuit board ground 077 and op-amp 081, which sends a signal to op-amp 082, which outputs audio signal 056. Resistors 087, 089, 090, 091 may be static resistors, and 092, 093, 094 may be variable resistors that change in resistance value depending on the audio input voltage and the and the amount of boom-factor desired. In one aspect, audio input voltage may be ~2 volts peak to peak. Diodes 095 and 096, e.g., 20 v Schottky diodes, allow one side of the audio wave to rise higher than the other side so that the full voltage range of the audio wave 056 may span the voltage range of the triangle reference wave 055. Positive and negative voltage supplies 085 and 086 may supply op-amps 081, 082, and variable resistor 093 with voltage, respectively.

Although illustrative embodiments have been shown and described herein in detail, it should be noted and will be appreciated by those skilled in the art that there may be numerous variations and other embodiments that may be equivalent to those explicitly shown and described. For example, the scope of the present invention is not necessarily limited in all cases to execution of the aforementioned steps in the order discussed. Unless otherwise specifically stated, terms and expressions have been used herein as terms of description, not of limitation. Accordingly, the invention is not to be limited by the specific illustrated and described embodiments (or the terms or expressions used to describe them) but only by the scope of claims.

What is claimed is:

1. A system for controlling an electromagnetic field generator, comprising:
    a plurality of transistors arranged in an H-bridge configuration, the H-bridge having first and second output terminals, first and second switching inputs, and a power input;
    a control transistor coupling the power input to a power supply; and
    a diode having a cathode coupled to the power input and an anode coupled to ground,
    wherein the first and second output terminals are coupled to the electromagnetic field generator and the first and second switching inputs receive switching signals based on an output of the electromagnetic field generator.

2. The system of claim 1, further comprising a diode having an anode coupled to the power input and a cathode coupled to the power supply.

3. The system of claim 1, further comprising, for each of the plurality of transistors arranged in the H-bridge configuration, a diode having an anode coupled to an emitter of the transistor and a cathode coupled to a collector of the transistor.

4. The system of claim 1, further comprising a circuit coupled to the electromagnetic field generator and generating first and second switching signals supplied to the first and second switching inputs, respectively.

5. The system of claim 1, further comprising
    a current drive transformer coupled to the electromagnetic field generator;
    an inverter coupling the current drive transformer to the first switching input; and
    a non-inverter coupling current drive transformer to the second switching input.

6. The system of claim 1, wherein the power supply comprises a DC voltage source and a capacitor coupled in parallel.

7. The system of claim 1, wherein the control transistor and the plurality of transistors arranged in an H-bridge configuration are IGBTs.

8. The system of claim 1, further comprising a processing circuit that generates a pulse width modulated signal based on an audio signal and a reference signal and provides the pulse width modulated signal to a base of the control transistor.

9. The system of claim 8, wherein the audio signal is raised compared to the center of the reference signal thereby creating a pulse width modulated signal with a reduced duty-cycle.

10. A system for controlling a resonant device, comprising:
    a control transistor having a collector coupled to a first terminal of a power supply and an emitter coupled to a first terminal of the resonant device;
    a first diode having a cathode coupled to the first terminal of the power supply and an anode coupled to the first terminal of the resonant device;
    a second diode having a cathode coupled to the first terminal of the resonant device and an anode coupled to a second terminal of the power supply; and
    a switching transistor having a source coupled to a second terminal of the resonant device, a drain coupled to the second terminal of the power supply and a gate receiving a switching signal.

11. The system of claim 10, wherein the switching transistor is a MOSFET and the switching signal is between 1 MHz and 6 MHz.

12. The system of claim 10, further comprising a processing circuit that generates a pulse width modulated signal based on an audio signal and a reference signal and provides the pulse width modulated signal to a base of the control transistor.

13. The system of claim 12, wherein the audio signal is raised compared to the center of the reference signal so that the pulse width modulated signal has a reduced duty-cycle.

14. The system of claim 10, wherein the resonant device is a Tesla device.

15. The system of claim 10, wherein the power supply comprises a DC voltage source and a capacitor coupled in parallel.

16. A method for controlling an electromagnetic field generator, comprising:
   a. generating a DC voltage and storing the DC voltage in a capacitor;
   b. applying the DC voltage to the power input of a plurality of transistors arranged in an H-bridge;
   c. controlling the application of the DC voltage to the H-bridge in step b based on a pulse width modulated signal;
   d. controlling a voltage applied from the outputs of the H-bridge to the electromagnetic field generator based on a switching signal;
   e. generating the switching signal using a feedback signal from the electromagnetic field generator.

17. The method of claim 16, further comprising:
   f. allowing current to flow across the H-bridge in a predetermined direction using a freewheel diode.

18. The method of claim 16, further comprising:
   f. allowing current to flow from the electromagnetic field generator to the capacitor under a predetermined condition.

19. The method of claim 16, further comprising:
   f. generating the pulse width modulated signal based on an audio signal and a reference signal, wherein the audio signal is raised compared to the center of the reference signal so that the pulse width modulated signal has a reduced duty-cycle.

20. The method of claim 16, wherein the electromagnetic field generator is a Tesla device.

* * * * *